(12) United States Patent
Ryu et al.

(10) Patent No.: US 9,184,237 B2
(45) Date of Patent: Nov. 10, 2015

(54) VERTICAL POWER TRANSISTOR WITH BUILT-IN GATE BUFFER

(71) Applicant: Cree, Inc., Durham, NC (US)

(72) Inventors: Sei-Hyung Ryu, Cary, NC (US); Craig Capell, Hillsborough, NC (US); Charlotte Jonas, Morrisville, NC (US); David Grider, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/926,313

(22) Filed: Jun. 25, 2013

(65) Prior Publication Data
US 2014/0374773 A1  Dec. 25, 2014

(51) Int. Cl.
| | |
|---|---|
| *H01L 27/092* | (2006.01) |
| *H01L 27/098* | (2006.01) |
| *H01L 29/16* | (2006.01) |
| *H01L 29/78* | (2006.01) |
| *H01L 21/8234* | (2006.01) |
| *H01L 21/8238* | (2006.01) |
| *H01L 27/088* | (2006.01) |
| *H01L 27/12* | (2006.01) |
| *H01L 21/82* | (2006.01) |

(52) U.S. Cl.
CPC .... *H01L 29/1608* (2013.01); *H01L 21/823487* (2013.01); *H01L 21/823885* (2013.01); *H01L 27/088* (2013.01); *H01L 27/098* (2013.01); *H01L 27/0922* (2013.01); *H01L 27/1207* (2013.01); *H01L 29/7802* (2013.01); *H01L 21/8213* (2013.01); *H01L 29/7803* (2013.01)

(58) Field of Classification Search
CPC ...... H01L 27/092; H01L 27/098; H01L 29/16
USPC ............. 257/287, 77, 256, 504, 371, 528
See application file for complete search history.

(56) References Cited

U.S. PATENT DOCUMENTS

| | | | | | |
|---|---|---|---|---|---|
| 5,578,860 | A | * | 11/1996 | Costa et al. | 257/528 |
| 6,124,628 | A | * | 9/2000 | Fujihira et al. | 257/630 |
| 6,229,179 | B1 | * | 5/2001 | Song et al. | 257/350 |
| 6,232,793 | B1 | * | 5/2001 | Arimoto et al. | 326/34 |
| 6,300,661 | B1 | * | 10/2001 | Kadosh et al. | 257/371 |
| 7,221,010 | B2 | * | 5/2007 | Ryu | 257/287 |
| 7,800,223 | B2 | * | 9/2010 | Anderson et al. | 257/724 |
| 2008/0084197 | A1 | * | 4/2008 | Williams et al. | 323/282 |
| 2009/0085117 | A1 | | 4/2009 | Harada et al. | |
| 2013/0214695 | A1 | * | 8/2013 | Sadwick | 315/224 |

FOREIGN PATENT DOCUMENTS

JP    2006049668 A    2/2006

OTHER PUBLICATIONS

Invitation to Pay Additional Fees and Partial International Search for PCT/US2014/034803, mailed Jul. 24, 2014, 5 pages.
International Search Report and Written Opinion for PCT/US2014/034803, mailed Sep. 23, 2014, 15 pages.

* cited by examiner

*Primary Examiner* — Sheng Zhu
(74) *Attorney, Agent, or Firm* — Anthony J. Josephson

(57) ABSTRACT

A vertical power transistor is monolithically packaged on a semiconductor die with gate buffer circuitry. The gate buffer circuitry is adapted to deliver a biasing voltage to a gate contact of the vertical power transistor for switching the device between an ON state and an OFF state. By monolithically packaging the gate buffer circuitry together with the vertical power transistor, parasitic inductance between the gate buffer circuitry and the gate of the vertical power transistor is minimized, thereby decreasing the switching time of the vertical power transistor and reducing switching noise.

15 Claims, 7 Drawing Sheets

VERTICAL POWER TRANSISTOR WITH BUILT-IN GATE BUFFER

GOVERNMENT SUPPORT

This invention was made with government funds under contract number DE-AR0000111 awarded by DOE/ARPA-E. The U.S. Government has rights in this invention.

FIELD OF THE DISCLOSURE

The present disclosure relates to power transistor devices. Specifically, the present disclosure relates to vertical power transistor devices with integrated gate buffer circuitry.

BACKGROUND

A vertical transistor is a type of transistor that is adapted for use in high power applications. An exemplary vertical transistor device is a vertical power metal-oxide field effect transistor (MOSFET), wherein a source and gate contact are located on a first surface of the vertical MOSFET device that is separated from a drain contact by a drift layer formed on a substrate. Vertical MOSFETs are sometimes referred to as vertical diffused MOSFETs (VDMOSFETs) or double-diffused MOSFETs (DMOSFETs). Due to their vertical structure, the voltage rating of a power MOSFET is a function of the doping concentration and thickness of the drift layer. Accordingly, high voltage power MOSFETs may be achieved with a relatively small footprint.

FIG. 1 shows an exemplary vertical power transistor 10. The power transistor 10 includes a substrate 12, a drift layer 14 formed over the substrate 12, one or more junction implants 16 in the surface of the drift layer 14 opposite the substrate 12, and a junction gate field effect transistor (JFET) region 18 between each one of the junction implants 16. Each one of the junction implants 16 is formed by an ion implantation process, and includes a deep well region 20, a base region 22, and a source region 24. Each deep well region 20 extends from a corner of the drift layer 14 opposite the substrate 12 downwards towards the substrate 12 and inwards towards the center of the drift layer 14. The deep well region 20 may be formed uniformly or include one or more protruding regions. Each base region 22 is formed vertically from the surface of the drift layer 14 opposite the substrate 12 down towards the substrate 12 along a portion of the inner edge of each one of the deep well regions 20. Each source region 24 is formed in a shallow portion on the surface of the drift layer 14 opposite the substrate 12, and extends laterally to overlap a portion of the deep well region 20 and the base region 22, without extending over either. The JFET region 18 defines a channel width 26 between each one of the junction implants 16.

A gate oxide layer 28 is positioned on the surface of the drift layer 14 opposite the substrate 12, and extends laterally between a portion of the surface of each source region 24, such that the gate oxide layer 28 partially overlaps and runs between the surface of each source region 24 in the junction implants 16. A gate contact 30 is positioned on top of the gate oxide layer 28. Two source contacts 32 are each positioned on the surface of the drift layer 14 opposite the substrate 12 such that each one of the source contacts 32 partially overlaps both the source region 24 and the deep well region 20 of one of the junction implants 16, respectively, and does not contact the gate oxide layer 28 or the gate contact 30. A drain contact 34 is located on the surface of the substrate 12 opposite the drift layer.

In operation, when a biasing voltage below the threshold voltage of the power transistor 10 is applied to the gate contact 30, a junction between each deep well region 20 and the drift layer 14 is reverse biased, thereby placing the power transistor 10 in an OFF state. In the OFF state of the power transistor 10, any voltage between the source contacts 32 and the drain contact 34 is supported by the drift layer 14. Due to the vertical structure of the power transistor 10, large voltages may be placed between the source contacts 32 and the drain contact 34 without damaging the device.

FIG. 2 shows operation of the power transistor 10 when the device is in an ON state. When a positive biasing voltage is applied to the gate contact 30 of the power transistor 10, an inversion channel layer 36 is formed at the surface of the drift layer 14 underneath the gate contact 30, thereby placing the power transistor 10 in an ON state. In the ON state of the power transistor 10, current (shown by the shaded region in FIG. 2) is allowed to flow from each one of the source contacts 32 through the inversion channel layer 36 and into the JFET region 18 of the drift layer 14. Once in the JFET region 18, current flows downward through the drift layer 14 towards the drain contact 34. An electric field presented by junctions formed between the deep well region 20, the base region 22, and the drift layer 14 constricts current flow in the JFET region 18 into a JFET channel 38. At a certain distance from the inversion channel layer 36 when the electric field presented by the junction implants 16 is diminished, the flow of current is disturbed laterally, or spread out in the drift layer 14, as shown in FIG. 2, before reaching the drain contact 34.

When switching between the OFF state and the ON state, the power transistor 10 may require a large input current at the gate contact 30, which generally cannot be provided by a standard control signal. Accordingly, gate buffer circuitry is coupled to the gate contact 30 of the power transistor 10 in order to deliver the necessary current to operate the device. The gate buffer circuitry is adapted to accept a low-current control signal and deliver a high-current output signal for driving the gate contact 30 of the power transistor 10.

FIG. 3 shows the power transistor 10 coupled to conventional gate buffer circuitry 40 for switching the power transistor 10 between an OFF state and an ON state. The conventional gate buffer circuitry 40 is constructed on a semiconductor die that is discrete and separate from the die on which the power transistor 10 is formed. The conventional gate buffer circuitry 40 includes a first PMOS transistor device 42 and a second NMOS transistor device 44 surrounded by a gate buffer substrate 46. The first PMOS transistor device 42 includes a body region 48 that surrounds a first implant well 50 and a second implant well 52, such that the first implant well 50 and the second implant well 52 are laterally separated within the body region. A gate oxide layer 54 is located on the surface of the body region 48, such that the gate oxide layer 54 partially overlaps and runs between the first implant well 50 and the second implant well 52. A gate contact 56 is located on top of the gate oxide layer 54. A source contact 58 is located on the surface of the second implant well 52, and a drain contact 60 is located on a surface of the second implant well 50, such that neither the source contact 58 nor the drain contact 60 contact the gate oxide layer 54 or the gate contact 56.

The second NMOS transistor 44 is also located in the gate buffer substrate 46, and includes a first implant well 62 and a second implant well 64. A gate oxide layer 66 is located on the surface of the gate buffer substrate 46, such that the gate oxide layer 66 partially overlaps and runs between the first implant well 62 and the second implant well 64. A gate contact 68 is located on top of the gate oxide layer 66. A source contact 70 is located on the surface of the first implant well 62, and a drain contact 72 is located on the surface of the second implant well 64, such that the source contact 70 and the drain contact 72 do not contact the gate oxide layer 66 or the gate contact 68.

The gate contact 56 of the first PMOS transistor device 42 is coupled to an input node 74. The source contact 58 of the first PMOS transistor device 42 is coupled to a supply voltage VDD. The drain contact 60 of the first PMOS transistor device 42 is coupled to an output node 76. The gate contact 68 of the second NMOS transistor device 44 is coupled to the input node 74. The source contact 70 of the second NMOS transistor device 44 is coupled to ground. The drain contact 72 of the second NMOS transistor device 44 is coupled to the output node 76. The gate contact 30 of the power transistor 10 is coupled to the output node 76 of the conventional gate buffer circuitry 40 via a wire bond 78 or a similar connection.

FIG. 4 shows a circuit diagram illustrating the equivalent circuit for the power transistor 10 and the conventional gate buffer circuitry 40 shown in FIG. 3. As described above, the first PMOS transistor device 42 includes a source contact 58 coupled to a supply voltage VDD, a drain contact 60 coupled to an output node 76, and a gate contact 56 coupled to an input node 74. The second NMOS transistor device 44 includes a drain contact 72 coupled to the output node 76, a source contact 70 coupled to ground, and a gate contact 68 coupled to the input node 74. The gate contact 30 of the power transistor 10 is coupled to the output node 76 of the conventional gate buffer circuitry 40. The drain contact 34 of the power transistor 10 may be used as a switching input, and the source contact 32 of the power transistor 10 may be used as a switching output.

In operation, when a control voltage VIN below the threshold voltage of the second NMOS transistor device 44 is applied to the input node 74 of the conventional gate buffer circuitry 40, the first PMOS transistor device 42 is placed in an ON state of operation, while the second NMOS transistor device 44 is placed in an OFF state of operation. Accordingly, the supply voltage VDD is delivered to the gate contact 30 of the power transistor 10, thereby placing the power transistor 10 in an ON state of operation. In the ON state of operation of the power transistor 10, a signal placed at the source contacts 32 of the power transistor 10 is delivered to the drain contact 34.

When a control voltage VIN higher than the supply voltage VDD less the threshold voltage of the first PMOS transistor device 42 is applied to the input node 74 of the conventional gate buffer circuitry 40, the first PMOS transistor device 42 is placed in an OFF state of operation, while the second NMOS transistor device 44 is placed in an ON state of operation. Accordingly, the gate contact 30 of the power transistor 10 is grounded, thereby placing the power transistor 10 in an OFF state of operation. In the OFF state of operation of the power transistor 10, a signal placed at the source contacts 32 of the power transistor 10 is not delivered to the drain contact 34.

Because the power transistor 10 is discrete and separate from the conventional gate buffer circuitry 40, the wire bond 78 used to couple the power transistor 10 to the conventional gate buffer circuitry 40 must be of significant length. Due to the length of the wire bond 78, parasitic inductance is introduced between the output node 76 of the conventional gate buffer circuitry 40 and the gate contact 30 of the power transistor 10. The parasitic inductance causes distortion in the output signal of the power transistor 10 and reduces the switching speed of the device.

Accordingly, there is a need for gate buffer circuitry that is capable of delivering the necessary current for operation of a power transistor device while reducing distortion in the output signal of the power transistor and reducing switching times.

SUMMARY

A vertical power transistor is monolithically packaged on a semiconductor die with gate buffer circuitry. The gate buffer circuitry is adapted to selectively deliver a biasing signal to a gate contact of the vertical power transistor for switching the device between an ON state and an OFF state based on a received control signal. By monolithically packaging the gate buffer circuitry together with the vertical power transistor on the same die, parasitic inductance between the gate buffer circuitry and the gate of the vertical power transistor is minimized, thereby decreasing the switching time of the vertical power transistor and reducing switching noise.

According to one embodiment, the gate buffer circuitry comprises a first NMOS transistor device and a second NMOS transistor device. The first NMOS transistor device includes a drain contact coupled to a supply voltage, a source contact coupled to an output node, and a gate contact coupled to an input node. The second NMOS device includes a drain contact coupled to the output node, a source contact coupled to ground, and a gate contact coupled to the input node. The gate contact of the vertical power transistor is coupled to the gate buffer circuitry at the output node. The first NMOS transistor device and the second NMOS transistor device are laterally disposed in an implanted P-well adjacent to the vertical power transistor.

According to one embodiment, the gate buffer circuitry comprises a first PMOS transistor device and a second NMOS transistor device. The first PMOS transistor device includes a source contact coupled to a supply voltage, a drain contact coupled to an output node, and a gate contact coupled to an input node. The second NMOS device includes a drain contact coupled to the output node, a source contact coupled to ground, and a gate contact coupled to the input node. The gate contact of the vertical power transistor is coupled to the gate buffer circuitry at the output node. The first PMOS transistor and the second NMOS transistor are laterally disposed in an implanted P-well adjacent to the vertical power transistor.

According to one embodiment, the first PMOS transistor device is enclosed in a silicon-carbide epitaxial layer grown on top of the implanted P-well.

According to an additional embodiment, the first PMOS transistor is a silicon-on-insulator (SOI) device on top of the implanted P-well.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
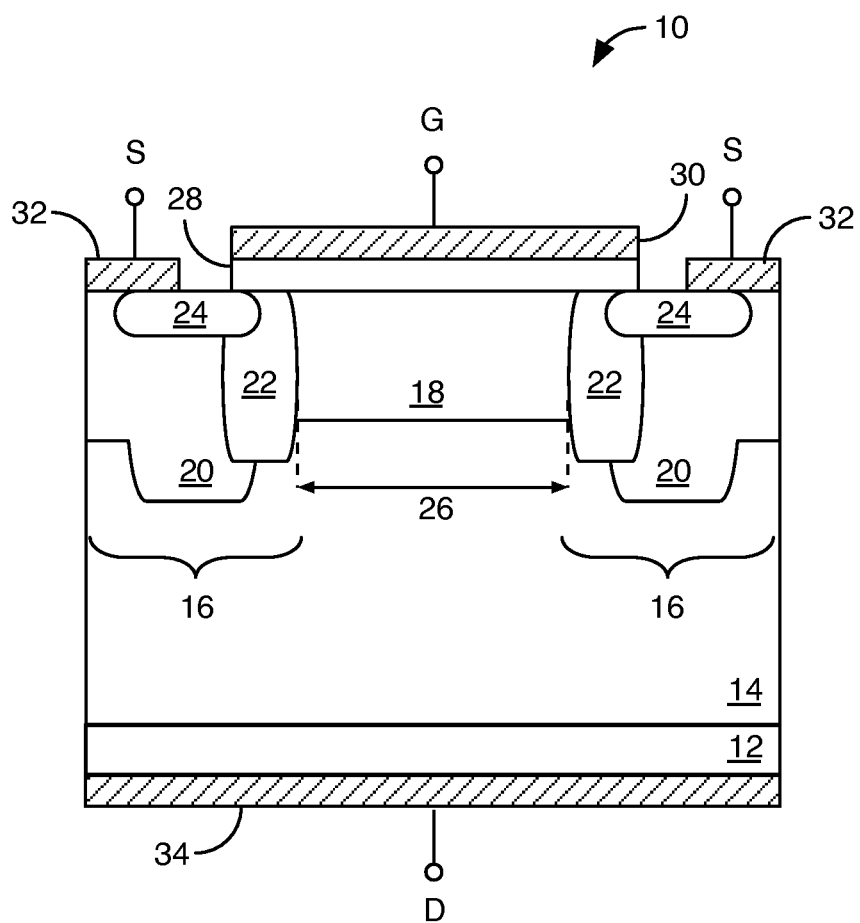
FIG. 1 is a schematic representation of a vertical power transistor device.
Figure 2:
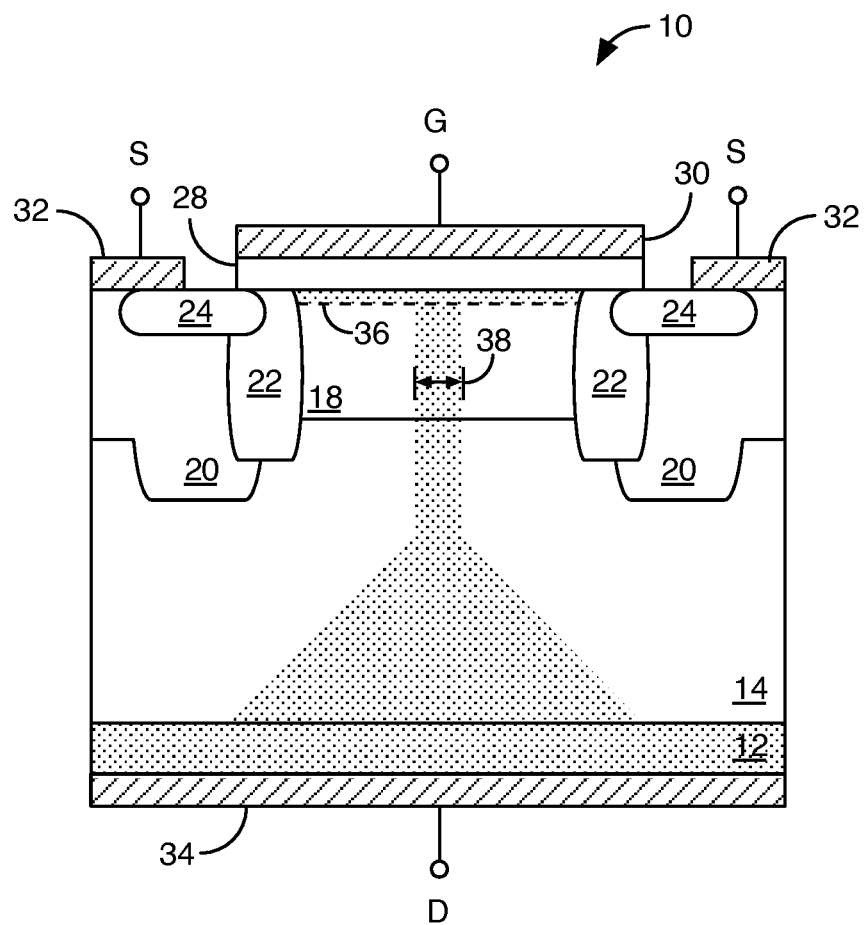
FIG. 2 illustrates the operation of the power transistor shown in FIG. 1 when the power MOSFET is in an ON state.
Figure 3:
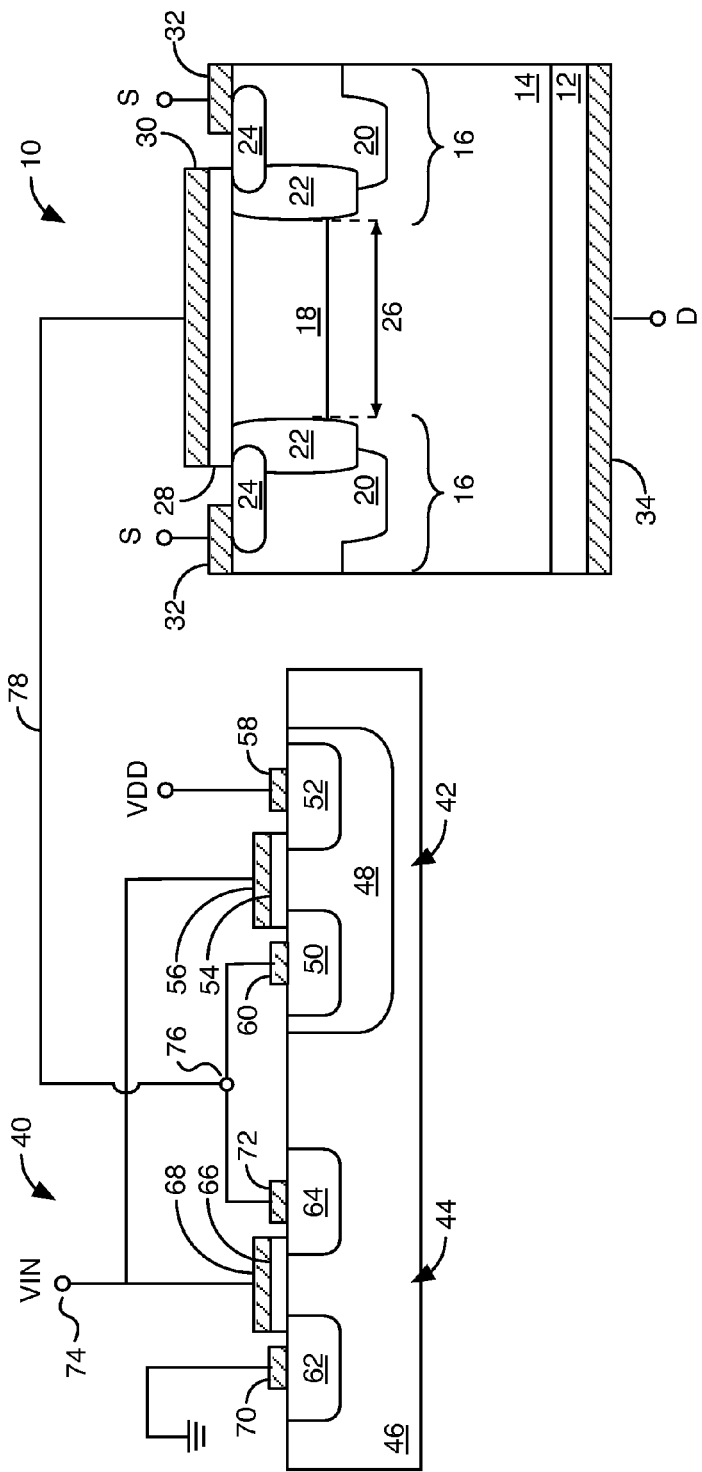
FIG. 3 is a schematic representation of the power transistor shown in FIG. 1 connected to conventional gate buffer circuitry.
Figure 4:
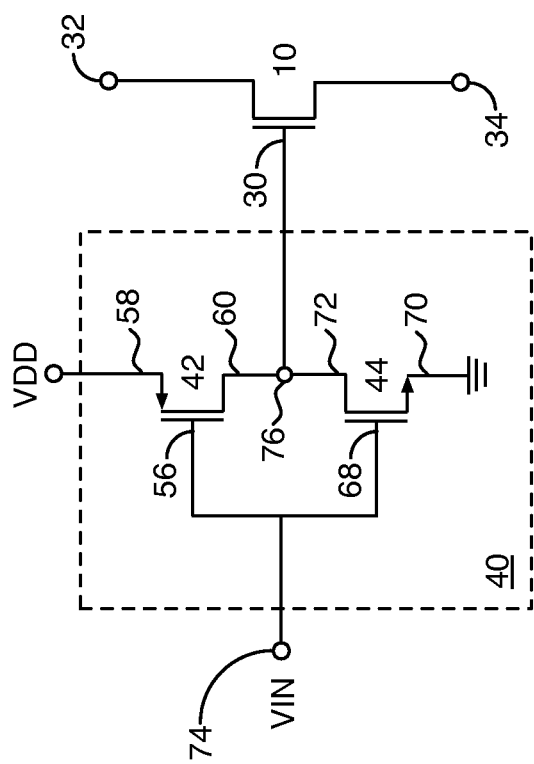
FIG. 4 is a schematic representation of the equivalent circuitry for the power transistor and the conventional gate buffer circuitry shown in FIG. 3.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 5:
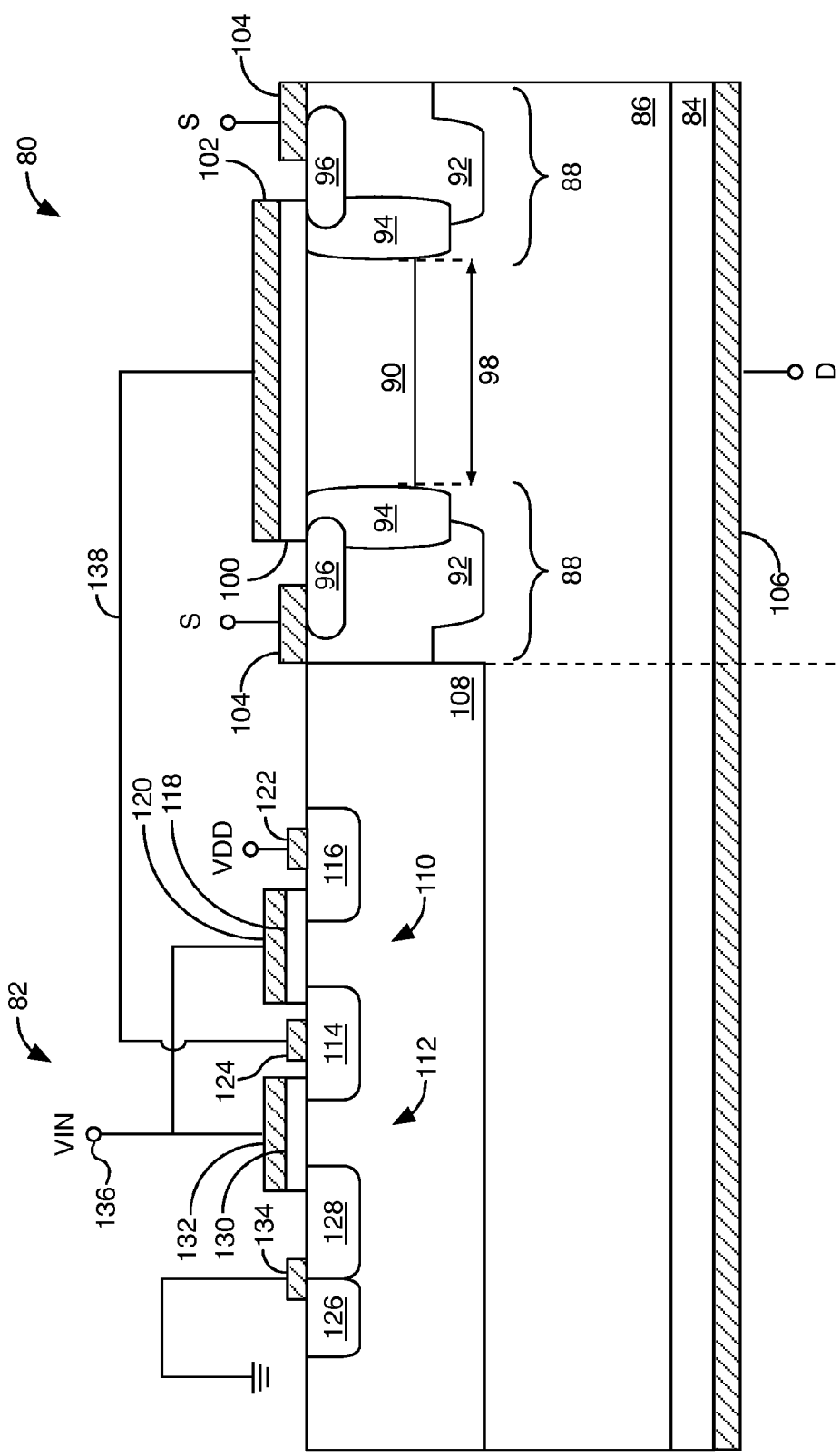
FIG. 5 is a schematic representation of a vertical power transistor including integrated gate buffer circuitry.

Turning now to FIG. 5, a power transistor 80 is shown including integrated gate buffer circuitry 82 according to one embodiment of the present disclosure. The power transistor 80 includes a substrate 84, a drift layer 86 formed over the substrate 84, one or more junction implants 88 in the surface of the drift layer 86 opposite the substrate 84, and a junction field effect transistor (JFET) region 90 between each one of the junction implants 88. Each one of the junction implants 88 includes a deep well region 92, a base region 94, and a source region 96. Each deep well region 92 extends from a corner of the drift layer 86 opposite the substrate 84 downwards towards the substrate 84 and inwards towards the center of the drift layer 86. The deep well region 92 may be formed uniformly or include one or more protruding regions. Each base region 94 is formed vertically from the surface of the drift layer 86 opposite the substrate 84 down towards the substrate 84 along a portion of the inner edge of each one of the deep well regions 92. Each source region 96 is formed in a shallow portion on the surface of the drift layer 86 opposite the substrate 84, and extends laterally to overlap a portion of the deep well region 92 and the base region 94 without extending over either. The JFET region 90 defines a channel width 98 between each one of the junction implants 88.

A gate oxide layer 100 is positioned on the surface of the drift layer 86 opposite the substrate 84, and extends laterally between a portion of each source region 96, such that the gate oxide layer 100 partially overlaps and runs between the surface of each source region 96 in the junction implants 88. A gate contact 102 is positioned on top of the gate oxide layer 100. Two source contacts 104 are each positioned on the surface of the drift layer 86 opposite the substrate 84 such that each one of the source contacts 104 partially overlaps both the source region 96 and the deep well region 92 of one of the junction implants 88, respectively, and does not contact the gate oxide layer 100 or the gate contact 102. A drain contact 106 is located on the surface of the substrate 84 opposite the drift layer 86.

According to one embodiment, the power transistor 80 is a metal-oxide semiconductor field effect transistor (MOSFET). Those of ordinary skill in the art will appreciate that the concepts of the present disclosure may be applied to any vertical transistor device, including a vertical field effect transistor (FET), high electron mobility transistor (HEMT), or the like.

According to one embodiment, the power transistor 80 is a silicon carbide (SiC) device. Those of ordinary skill in the art will appreciate that the concepts of the present disclosure may be applied to any materials system. The substrate 84 of the power transistor 80 may be about 50-400 microns thick. The drift layer 86 may be about 5-120 microns thick. Each one of the junction implants 88 may be about 0.2-2.0 microns thick. The JFET region 90 may be about 0.2-2.0 microns thick.

According to one embodiment, the substrate 84 of the power transistor 80 is an N-doped layer with a doping concentration from about $1 \times 10^{18}$ cm$^{-3}$ to $1 \times 10^{21}$ cm$^{-3}$. The drift layer 86 may be an N-doped layer with a doping concentration from about $5 \times 10^{14}$ cm$^{-3}$ to $1 \times 10^{17}$ cm$^{-3}$. The deep well region may be a heavily doped P-region with a doping concentration from about $1 \times 10^{17}$ cm$^{-3}$ to $1 \times 10^{21}$ cm$^{-3}$. The base region 94 may be a P-doped region with a doping concentration from about $1 \times 10^{16}$ cm$^{-3}$ to $5 \times 10^{18}$ cm$^{-3}$. The source region 96 may be an N-doped region with a doping concentration from about $5 \times 10^{18}$ cm$^{-3}$ to $1 \times 10^{21}$ cm$^{-3}$. The doping agent may be nitrogen, phosphorous, or any other suitable element, as will be appreciated by those of ordinary skill in the art. The P doping agent may be aluminum, boron, or any other suitable element, as will be appreciated by those of ordinary skill in the art.

In operation, when a biasing voltage below the threshold voltage of the power transistor 80 applied to the gate contact 102 and the drain contact 106 is positively biased, a junction between each deep well region 92 and the drift layer 86 is reverse biased, thereby placing the power transistor 80 in an OFF state. In the OFF state of the power transistor 80, a signal placed at the source contacts 104 of the power transistor 80 is not passed to the drain contact 106 of the power transistor 80, and is instead supported by the drift layer 86. Due to the vertical structure of the power transistor 80, high amplitude signals may be placed between the source contacts 104 and the drain contact 106 without damaging the device. When a biasing voltage above the threshold voltage of the power transistor 80 is applied to the gate contact 102, the power transistor 80 is placed in an ON state. In the ON state of the power transistor 80, a signal placed at the source contacts 104 of the power transistor 80 is passed to the drain contact 106 of the power transistor 80 through the drift layer 86. When switching the power transistor 80 from an OFF state to an ON state, the gate contact 102 of the power transistor 80 may demand a high amount of current. Accordingly, the integrated gate buffer circuitry 82 is provided.

The integrated gate buffer circuitry 82 includes a gate buffer well 108 in the surface of the drift layer 86 opposite the substrate 84 that runs the length of the integrated gate buffer circuitry 82. According to one embodiment, the gate buffer well 108 is implanted via an ion implantation process. The gate buffer well 108 may be as deep or deeper than the junction implants 88 of the power transistor 80, and surrounds a first NMOS transistor device 110 and a second NMOS transistor device 112. The first NMOS transistor device 110 includes a first implant well 114 and a second implant well 116 that is laterally separated from the first implant well 114. A gate oxide layer 118 is located on the surface of the gate buffer well 108, such that the gate oxide layer 118 partially overlaps and runs between the first implant well 114 and the second implant well 116. A gate contact 120 is located on top of the gate oxide layer 118. A shared drain/source contact 124 is located on a portion of the surface of the first implant well 114, such that the shared drain/source contact 124 does not contact the gate oxide layer 118 or the gate contact 120. A drain contact 122 is formed on a portion of the surface of the second implant well 116, such that the drain contact 122 does not contact the gate oxide layer 118 or the gate contact 120.

The second NMOS transistor device 112 includes the first implant well 114, a third implant well 126, and a fourth implant well 128 that is adjacent to the third implant well 126 and laterally separated from the first implant well 114. A gate oxide layer 130 is located on the surface of the gate buffer well 108, such that the gate oxide layer 130 partially overlaps and runs between the first implant well 114 and the fourth implant well 128. A gate contact 132 is located on top of the gate oxide layer 130. A source contact 134 is located on the surface of a portion of each one of the third implant well 126 and the fourth implant well 128, such that the source contact 134 does not contact the gate oxide layer 130 or the gate contact 132. The shared drain/source contact 124 is also a part of the second NMOS transistor device 112.

The drain contact 122 of the first NMOS transistor device 110 is coupled to a supply voltage VDD. The gate contact 120 of the first NMOS transistor device 110 and the gate contact 132 of the second NMOS transistor device 112 are coupled to an input node 136. According to one embodiment, an external inverter (not shown) is coupled between the gate contact 120 of the first NMOS transistor device 110 and the input node 136. The shared drain/source contact 124 of the first NMOS transistor device 110 and the second NMOS transistor device 112 is coupled to the gate contact 102 of the power transistor 80 via a wire bond 138 or similar connection. The source contact 134 of the second NMOS transistor device 112 is coupled to ground.

The gate buffer well 108 may be about 1.0-3.0 microns thick. The first implant well 114, the second implant well 116, the third implant well 126, and the fourth implant well 128 may be about 0.2-1.0 microns thick.

According to one embodiment, the gate buffer well 108 is a P-doped region with a doping concentration from about $5 \times 10^{15}$ cm$^{-3}$ to $5 \times 10^{19}$ cm$^{-3}$. The first implant well 126 may be a P doped region with a doping concentration from about $1 \times 10^{18}$ cm$^{-3}$ to $1 \times 10^{21}$ cm$^{-3}$. The second implant well 116, the third implant well 114, and the fourth implant well 128 may be N-doped regions with a doping concentration from about $1 \times 10^{18}$ cm$^{-3}$ to $1 \times 10^{21}$ cm$^{-3}$. The N doping agent may be nitrogen, phosphorous, or any other suitable element, as will be appreciated by those of ordinary skill in the art. The P doping agent may be aluminum, boron, or any other suitable element, as will be appreciated by those of ordinary skill in the art.

By monolithically integrating the power transistor 80 and the integrated gate buffer circuitry 82 onto a single semiconductor die, the length of the wire bond 138 between the gate contact 102 of the power transistor 80 and the shared drain/source contact 124 of the first NMOS transistor device 110 and the second NMOS transistor device 112 is minimized. Accordingly, the parasitic inductance associated with the wire bond 138 will be lower than is otherwise achievable by conventional means, thereby decreasing the switching time of the power transistor 80 and reducing distortion in the signal path of the power transistor 80.

Although the power transistor 80 is shown as a single transistor device in FIG. 5, those of ordinary skill in the art will appreciate that the power transistor 80 may comprise any number of transistor devices. Further, those of ordinary skill in the art will appreciate that the first NMOS transistor device 110, the second NMOS transistor device 112, or both, may comprise any number of transistor devices without departing from the principles of the present disclosure.

Figure 6:
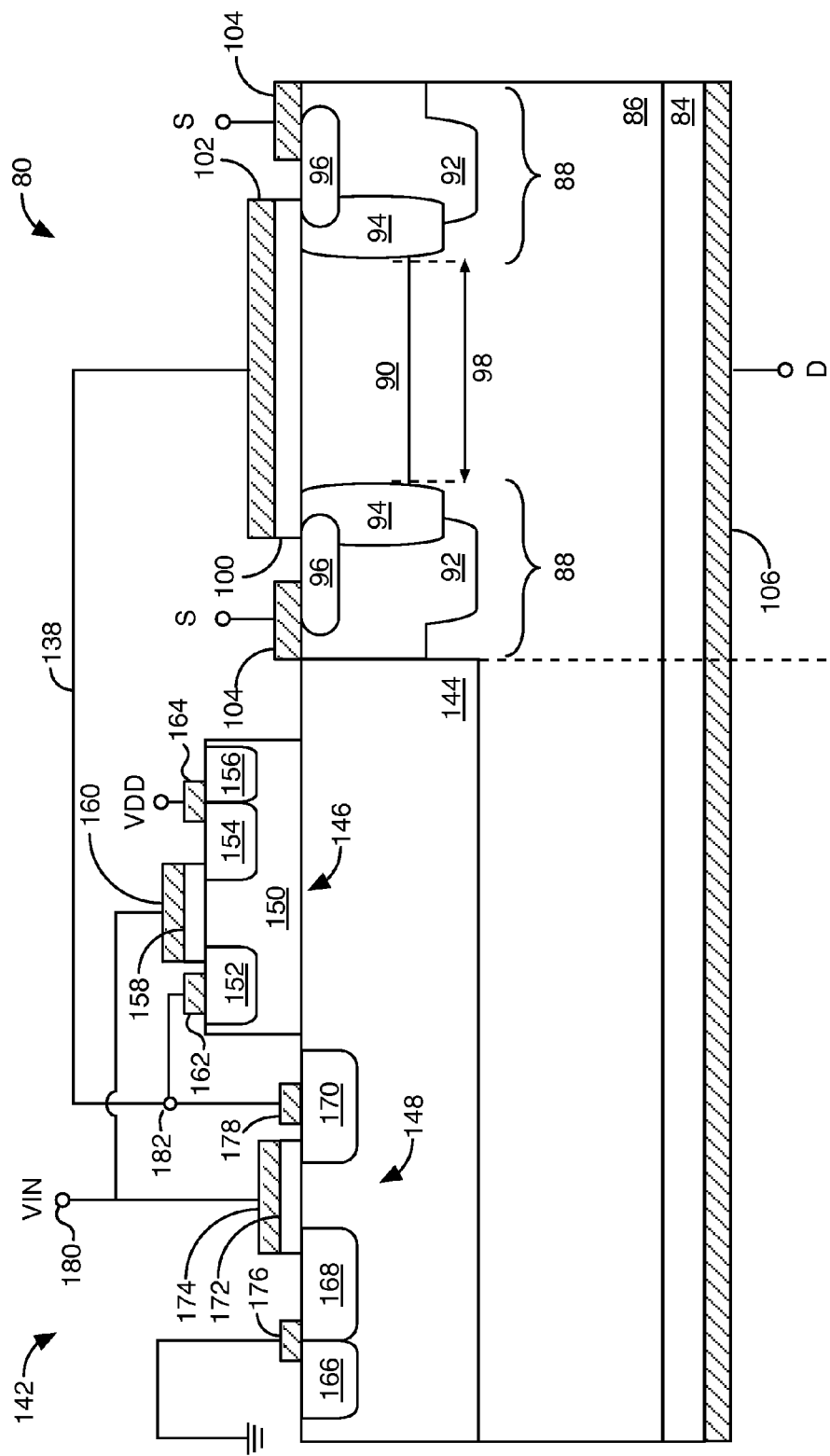
FIG. 6 is a schematic representation of an additional embodiment of the vertical power transistor including integrated gate buffer circuitry.

FIG. 6 shows the power transistor 80 including integrated gate buffer circuitry 142 according to an additional embodiment of the present disclosure. The integrated gate buffer circuitry 142 includes a gate buffer well 144 in the surface of the drift layer 86 opposite the substrate 84 that runs the length of the integrated gate buffer circuitry 142. According to one embodiment, the gate buffer well 144 is implanted via an ion implantation process. The gate buffer well 144 may run as deep or deeper than the junction implants 88 of the power transistor 80, and surrounds a first PMOS transistor device 146 and a second NMOS transistor device 148. The first PMOS transistor device 146 includes a body region 150 on top of the gate buffer well 144 opposite the drift layer 86. The body region 150 may comprise silicon carbide (SiC), silicon (Si), or the like. According to one embodiment, the body region 150 is an epitaxial layer grown on the surface of the gate buffer well 144. According to an additional embodiment, the body region 150 is implanted in the gate buffer well 144.

The first PMOS transistor device 146 may include a first implant well 152 on the surface of the body region 150 opposite the gate buffer well 144, a second implant well 154 that is laterally separated from the first implant well 152, and a third implant well 156 adjacent to and in contact with the second implant well 154. A gate oxide layer 158 is located on the surface of the body region 150 opposite the gate buffer well 144, such that the gate oxide layer 158 partially overlaps and runs between the first implant well 152 and the second implant well 154. A gate contact 160 is located on top of the gate oxide layer 158. A drain contact 162 is located on a portion of the surface of the first implant well 152, such that the drain contact 162 does not contact the gate oxide layer 158 or the gate contact 160. A source contact 164 is located on a portion of both the surface of the second implant well 154 and surface of the third implant well 156.

The second NMOS transistor device 148 includes a fourth implant well 166 on the surface of the gate buffer well 144 opposite the drift layer 86, a fifth implant well 168 adjacent to and in contact with the fourth implant well 166, and a sixth implant well 170 that is laterally separated from the fifth implant well 168. A gate oxide layer 172 is located on the surface of the gate buffer well 144 opposite the drift layer 86, such that the gate oxide layer 172 partially overlaps and runs between the fifth implant well 168 and the sixth implant well 170. A gate contact 174 is located on top of the gate oxide layer 172. A source contact 176 is located on a portion of both the surface of the fourth implant well 166 and the fifth implant well 168, such that the source contact 176 does not contact the gate oxide layer 172 or the gate contact 174. A drain contact 178 is located on a portion of the surface of the sixth implant well 170 such that the drain contact 178 does not contact the gate oxide layer 172 or the gate contact 174.

The source contact 164 of the first PMOS transistor device 146 is coupled to a supply voltage VDD. The gate contact of the first PMOS transistor device 146 is coupled to an input node 180. The drain contact 162 of the first PMOS transistor device 146 is coupled to an output node 182. The source contact 176 of the second NMOS transistor device 148 is coupled to ground. The gate contact 174 of the second NMOS transistor device 148 is coupled to the input node 180. The drain contact 178 of the second NMOS transistor device 148 is coupled to the output node 182. The gate contact 102 of the power transistor 80 is coupled to the output node 182 via the wire bond 138.

The gate buffer well 144 may be about 1.0-3.0 microns thick. The body region 150 of the first PMOS transistor device 146 may be about 1.0-5.0 microns thick. The first implant well 152 and the second implant well 154 of the first PMOS transistor device 146 may be about 0.2-1.0 microns thick. The third implant well 156 of the first PMOS transistor device 146 may be about 0.2-1.0 microns thick. The fourth implant well 166 of the second NMOS transistor device 148 may be about 0.2-1.0 microns thick. The fifth implant well 168 and the sixth implant well 170 may be about 0.2-1.0 microns thick.

According to one embodiment, the gate buffer well 144 is a P-doped region with a doping concentration from about $5 \times 10^{15}$ cm$^{-3}$ to $5 \times 10^{19}$ cm$^{-3}$. The first implant well 152 and the second implant well 154 of the first PMOS transistor device 146 may be P-doped layers with a doping concentration from about $1 \times 10^{18}$ cm$^{-3}$ to $1 \times 10^{21}$ cm$^{-3}$. The third implant well 156 of the first PMOS transistor device 146 may be an N-type doped region with a doping concentration from about $1 \times 10^{18}$ cm$^{-3}$ to $1 \times 10^{21}$ cm$^{-3}$. The fourth implant well 166 of the second NMOS transistor device 148 may be a P-type doped region with a doping concentration from about $1 \times 10^{18}$ cm$^{-3}$ to $1 \times 10^{21}$ cm$^{-3}$. The fifth implant well 168 and the sixth implant well 170 of the second NMOS transistor device 148 may be N-doped regions with a doping concentration from about $1 \times 10^{18}$ cm$^{-3}$ to $1 \times 10^{21}$ cm$^{-3}$.

By monolithically integrating the power transistor 80 and the integrated gate buffer circuitry 142 onto a single semiconductor die, the length of the wire bond 138 between the gate contact 102 of the power transistor 80 and the output node 182 is minimized. Accordingly, the parasitic inductance associated with the wire bond 138 will be lower than is otherwise achievable by conventional means, thereby decreasing the switching time of the power transistor 80 and reducing distortion in the signal path of the power transistor 80.

As will be appreciated by those of ordinary skill in the art, the first PMOS transistor device 146 and the second NMOS transistor device 148 may comprise any number of transistor devices without departing from the principles of the present disclosure.

Figure 7:
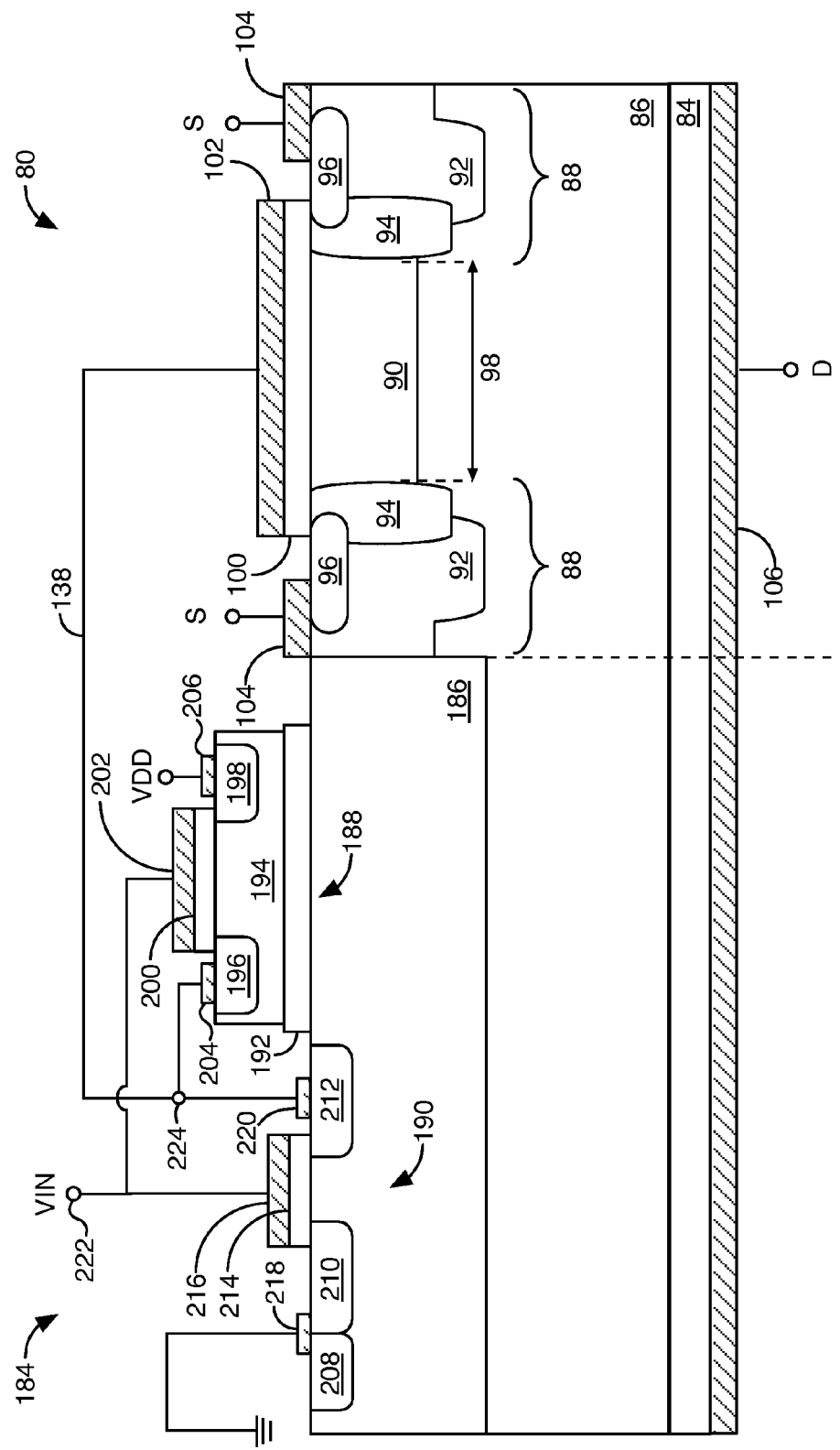
FIG. 7 is a schematic representation of an additional embodiment of the vertical power transistor including integrated gate buffer circuitry.

FIG. 7 shows the power transistor 80 including integrated gate buffer circuitry 184 according to an additional embodiment of the present disclosure. The integrated gate buffer circuitry 184 includes a gate buffer well 186 on the surface of the drift layer 86 opposite the substrate 84 that runs the length of the integrated gate buffer circuitry 184. According to one embodiment, the gate buffer well 186 is implanted via n ion implantation process. The gate buffer well 186 may run as deep or deeper than the junction implants 88 of the power transistor 80, and surrounds a first PMOS transistor device 188 and a second NMOS transistor device 190. The first PMOS transistor device 188 includes a field oxide layer 192 on the surface of the gate buffer well 186 opposite the drift layer 86, a body region 194 over the field oxide layer 192 opposite the gate buffer well 186, a first implant well 196 on the surface of the body region 194 opposite the field oxide layer 192, and a second implant well 198 that is laterally separated from the first implant well 196. A gate oxide layer 200 is located on the surface of the body region 194 opposite the field oxide layer 192, such that the gate oxide layer 200 partially overlaps and runs between the first implant well 196 and the second implant well 198. A gate contact 202 is located on top of the gate oxide layer 200. A drain contact 204 is located on the surface of a portion of the first implant well 196, such that the drain contact 204 does not contact the gate oxide layer 200 or the gate contact 202. A source contact 206 is located on the surface of a portion of the second implant well 198, such that the source contact 206 does not contact the gate oxide layer 200 or the gate contact 202.

The second NMOS transistor device 190 includes a third implant well 208 on the surface of the gate buffer well 186 opposite the drift layer 86, a fourth implant well 210 adjacent to and in contact with the third implant well 208, and a fifth implant well 212 that is laterally separated from the fourth implant well 210. A gate oxide layer 214 is located on the surface of the gate buffer well 186 opposite the drift layer 86, such that the gate oxide layer 214 partially overlaps and runs between the fourth implant well 210 and the fifth implant well 212. A gate contact 216 is located on top of the gate oxide layer 214. A source contact 218 is located on a portion of both the surface of the third implant well 208 and the fourth implant well 210, such that the source contact 218 does not contact the gate oxide layer 214 or the gate contact 216. A drain contact 220 is located on a portion of the surface of the fifth implant well 212, such that the drain contact 220 does not contact the gate oxide layer 214 or the gate contact 216.

The source contact 206 of the first PMOS transistor device 188 is coupled to a supply voltage VDD. The gate contact 202 of the first PMOS transistor device 188 is coupled to an input node 222. The drain contact 204 of the first PMOS transistor device 188 is coupled to an output node 224. The source contact 218 of the second NMOS transistor device 190 is coupled to ground. The gate contact 216 of the second NMOS transistor device 190 is coupled to the input node 222. The drain contact 220 of the second NMOS transistor device 190 is coupled to the output node 224. The gate contact 102 of the power transistor 80 is coupled to the output node 224 via the wire bond 138.

The gate buffer well 186 may be about 1.0-3.0 microns thick. The field oxide layer 192 of the first PMOS transistor device 188 may be about 0.1-2.0 microns thick. The body region 194 of the first PMOS transistor device 188 may be about 0.1-2.0 microns thick. The first implant well 196 and the second implant well 198 of the first PMOS transistor device 188 may be about 0.1-2.0 microns thick. The third implant well 208 of the second NMOS transistor device 190 may be about 0.2-1.0 microns thick. The fourth implant well 210 and the fifth implant well 212 of the second NMOS transistor device 190 may be about 0.2-1.0 microns thick.

According to one embodiment, the gate buffer well 186 is a P-doped region with a doping concentration from about $5 \times 10^{15}$ cm$^{-3}$ to $5 \times 10^{19}$ cm$^{-3}$. The first implant well 196 and the second implant well 198 of the first PMOS transistor device 188 may be P-doped layers with a doping concentration from about $1 \times 10^{18}$ cm$^{-3}$ to $1 \times 10^{21}$ cm$^{-3}$. The third implant well 208 of the second NMOS transistor device 190 may be a P-type doped region with a doping concentration from about $1 \times 10^{18}$ cm$^{-3}$ to $1 \times 10^{21}$ cm$^{-3}$. The fourth implant well 210 and the fifth implant well 212 of the second NMOS transistor device 190 may be N-doped regions with a doping concentration from about $1 \times 10^{18}$ cm$^{-3}$ to $1 \times 10^{21}$ cm$^{-3}$.

By monolithically integrating the power transistor 80 and the integrated gate buffer circuitry 184 onto a single semiconductor die, the length of the wire bond 138 between the gate contact 102 of the power transistor 80 and the output node 224 is minimized. Accordingly, the parasitic inductance associated with the wire bond 138 will be lower than is otherwise achievable by conventional means, thereby decreasing the switching time of the power transistor 80 and reducing distortion in the signal path of the power transistor 80.

As will be appreciated by those of ordinary skill in the art, the first PMOS transistor device 188 and the second NMOS transistor device 190 may comprise any number of transistor devices without departing from the principles of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising:
    a substrate;
    a drift layer on the substrate;
    a vertical power transistor comprising:
        a pair of junction implants in the drift layer and separated by a JFET region;
        a gate oxide layer and a source contact on the drift layer;
        a gate contact on the gate oxide layer; and
        a drain contact on the substrate opposite the drift layer; and
    gate buffer circuitry configured to selectively deliver a biasing signal to the gate contact of the vertical power transistor for switching the vertical power transistor between an ON state and an OFF state, the gate buffer circuitry comprising:
        a gate buffer well in the drift layer and adjacent to the vertical power transistor;
        a body region on at least a portion of the gate buffer well;
        a first gate buffer transistor within the body region; and
        a second gate buffer transistor within the gate buffer well.

2. The semiconductor die of claim 1 wherein the vertical power transistor is a metal-oxide semiconductor field effect transistor (MOSFET).

3. The semiconductor die of claim 1 wherein the vertical power transistor is a silicon-carbide (SiC) device.

4. The semiconductor die of claim 1 wherein the gate buffer circuitry is configured to selectively deliver the biasing signal to the gate contact of the vertical power transistor based on a received control signal.

5. The semiconductor die of claim 1 wherein the first gate buffer transistor is a PMOS transistor and the second gate buffer transistor is an NMOS transistor.

6. The semiconductor die of claim 5 wherein the PMOS transistor comprises:
    the body region;
    a first implant well in the body region;
    a second implant well that is laterally separated from the first implant well and in the body region;
    a third implant well that is adjacent to and in contact with the second implant well in the body region;
    a gate oxide layer on at least a portion of the body region such that the gate oxide layer partially overlaps and runs between the first implant well and the second implant well;
    a gate contact on the gate oxide layer;
    a drain contact on at least a portion of the first implant well; and
    a source contact on at least a portion of both the second implant well and the third implant well.

7. The semiconductor die of claim 6 wherein the NMOS transistor comprises:
    a fourth implant well in the gate buffer well;
    a fifth implant well that is adjacent to and in contact with the fourth implant well in the gate buffer well;
    a sixth implant well that is laterally separated from the fifth implant well and in the gate buffer well;
    a gate oxide layer on at least a portion of the gate buffer well such that the gate oxide layer partially overlaps and runs between the fifth implant well and the sixth implant well;
    a gate contact located on the gate oxide layer;
    a source contact on at least a portion of both the fourth implant well and the fifth implant well; and
    a drain contact on at least a portion of the sixth implant well.

8. The semiconductor die of claim 6 wherein the body region is silicon carbide (SiC).

9. The semiconductor die of claim 7 wherein:
    the source contact of the PMOS transistor is coupled to a supply voltage;
    the gate contact of the PMOS transistor and the gate contact of the NMOS transistor are coupled to an input node;

the drain contact of the PMOS transistor and the drain contact of the NMOS transistor are coupled to an output node;

the source contact of the NMOS transistor is coupled to ground; and the gate contact of the vertical power transistor is coupled to the output node.

10. The semiconductor die of claim 5 wherein the PMOS transistor comprises:
a field oxide layer between the body region and the gate buffer well;
the body region;
a first implant well in the body region;
a second implant well that is laterally separated from the first implant well and in the body region;
a gate oxide layer on at least a portion of the body region such that the gate oxide layer partially overlaps and runs between the first implant well and the second implant well;
a gate contact located on the gate oxide layer;
a drain contact on at least a portion of the first implant well; and
a source contact on at least a portion of the second implant well.

11. The semiconductor die of claim 10 wherein the NMOS transistor comprises:
a third implant well in the gate buffer well;
a fourth implant well that is adjacent to and in contact with the third implant well in the gate buffer well;
a fifth implant well that is laterally separated from the fourth implant well and in the gate buffer well;
a gate oxide layer on at least a portion of the gate buffer well such that the gate oxide layer partially overlaps and runs between the fourth implant well and the fifth implant well;
a gate contact located on the gate oxide layer;
a source contact on at least a portion of both the third implant well and the fourth implant well; and
a drain contact on at least a portion of the fifth implant.

12. The semiconductor die of claim 11 wherein the body region is silicon (Si).

13. The semiconductor die of claim 11 wherein:
the source contact of the PMOS transistor is coupled to a supply voltage;
the gate contact of the PMOS transistor and the gate contact of the NMOS transistor are coupled to an input node;
the drain contact of the PMOS transistor and the drain contact of the NMOS transistor are coupled to an output node;
the source contact of the NMOS transistor is coupled to ground; and
the gate contact of the vertical power transistor is coupled to the output node.

14. The semiconductor die of claim 1 wherein:
the first gate buffer transistor is a PMOS transistor comprising a gate contact coupled to an input node, a source contact coupled to a supply voltage, and a drain contact coupled to an output node; and
the second gate buffer transistor is an NMOS transistor comprising a gate contact coupled to the input node, a drain contact coupled to the output node, and a source contact coupled to ground.

15. The semiconductor die of claim 14 wherein the gate contact of the vertical power transistor is coupled to the output node.

* * * * *